United States Patent [19]

Krieger et al.

[11] Patent Number: 4,763,184

[45] Date of Patent: Aug. 9, 1988

[54] INPUT CIRCUIT FOR PROTECTING AGAINST DAMAGE CAUSED BY ELECTROSTATIC DISCHARGE

[75] Inventors: Gadi Krieger, Stanford; Boaz Eitan, Sunnyvale, both of Calif.

[73] Assignee: WaferScale Integration, Inc., Fremont, Calif.

[21] Appl. No.: 728,738

[22] Filed: Apr. 30, 1985

[51] Int. Cl.$^4$ .................... H01L 29/78; H01L 27/02; H01L 29/72; H02H 9/00

[52] U.S. Cl. .................... 357/23.13; 357/51; 357/43; 357/35; 357/20; 361/56; 361/91

[58] Field of Search ............... 357/23.13, 51, 35, 43, 357/20; 361/56, 91

[56] References Cited

U.S. PATENT DOCUMENTS

| | | | |
|---|---|---|---|
| 3,395,290 | 7/1968 | Farina et al. | 307/202 |
| 3,403,270 | 9/1968 | Pace et al. | 307/304 |
| 3,512,058 | 5/1970 | Khajezadeh et al. | 317/235 |
| 3,590,340 | 6/1971 | Kubo et al. | 317/235 R |
| 3,648,129 | 3/1972 | Nienhuis | 317/235 |
| 3,739,238 | 6/1973 | Hara | 317/235 R |
| 3,787,717 | 1/1974 | Fischer et al. | 317/235 R |
| 4,080,616 | 3/1978 | Horie | 357/13 |
| 4,228,450 | 10/1980 | Anantha et al. | 357/51 |
| 4,264,941 | 4/1981 | London | 361/91 |
| 4,437,135 | 3/1984 | Ogata et al. | 361/91 |
| 4,630,162 | 12/1986 | Bell et al. | 361/91 |

FOREIGN PATENT DOCUMENTS

| | | | |
|---|---|---|---|
| 0143061 | 11/1980 | Japan | 357/23.13 |
| 0078178 | 5/1982 | Japan | 357/23.13 |
| 0123768 | 7/1983 | Japan | 357/23.13 |
| 0257576 | 12/1985 | Japan | 357/23.13 |

OTHER PUBLICATIONS

Lenzlinger, "Gate Protection of MIS Devices", IEEE Trans. Elect. Dev., vol. FD-18, No. 4, pp. 249-257, (Apr. 1971).

Primary Examiner—Martin H. Edlow
Assistant Examiner—Donald J. Featherstone
Attorney, Agent, or Firm—Kenneth E. Leeds; Alan H. MacPherson; Paul J. Winters

[57] ABSTRACT

A circuit for protecting an input MOS FET (Q1) from electrostatic discharge pulses includes a plurality of diodes (D112a through D112f) coupled to the bonding pad (102) of an integrated circuit via a plurality of resistors (R110a through R110f). The resistors prevent excessive current from flowing through and hence damaging any of the diodes. The diodes possess a unique shape which maximizes the perimeter to surface area ratio and therefore permits more efficient energy dissipation along the periphery of the diodes. The diodes are adapted to break down in response to an excessive voltage at the bonding pad and therefor protect the gate structure of the input transistor. Also included in the circuit is a protective bipolar transistor (Q2) having a collector coupled to the bonding pad, an emitter coupled to ground and a base resistively coupled to ground. When a large voltage is applied to the bonding pad and the break down of the diodes is insufficient to limit the voltage at the bonding pad, the collector base junction of the bipolar transistor breaks down thus providing an added element of protection for the input MOS FET. The circuit of the present invention also includes a second resistor diode network which further attenuates the voltage presented to the gate of the input transistor.

15 Claims, 4 Drawing Sheets

INPUT CIRCUIT FOR PROTECTING AGAINST DAMAGE CAUSED BY ELECTROSTATIC DISCHARGE

BACKGROUND OF INVENTION

1. Field of the Invention

This invention relates to integrated circuits and more specifically to input structures in integrated circuits for protecting against damage caused by electrostatic discharge (ESD).

2. Description of the Prior Art

Electrostatic discharge pulses are a well known phenomenon and can be generated by any of a number of causes, e.g., when a person walks across a carpet and touches a grounded metal object. These pulses, which can be several thousand volts, are known to destroy integrated circuits and especially MOS integrated circuits. Such a pulse typically destroys the gate dielectric of MOS devices thereby rendering the devices inoperative. It is known in the art to provide a variety of devices connected to the input pins of MOS integrated circuits to reduce the likelihood of damage caused by electrostatic discharge. An overview of such structures is provided in "Gate Protection of MIS Devices" by Martin Lenzlinger, published in IEEE Transactions on Electronic Devices, Volume FD-18, No. 4 in April 1971.

Lenzlinger discusses the use of a diode as a gate protection device for a P channel MOS transistor as illustrated in FIG. 1a. When the voltage at the gate of a P channel MOS transistor 12 increases negatively, e.g., as the result of an ESD pulse, a diode 14 breaks down so that the voltage present at the gate of transistor 12 is limited to the breakdown voltage of the diode. A positive ESD pulse on input lead 10 forward biases and thus turns on diode 14 thereby protecting the gate of transistor 12. During normal operation, diode 14 is reverse biased and its only effects are an increase in input capacitance and leakage current. In most applications, these effects are negligible. When voltages outside the normal operating range are applied to the gate of transistor 12, diode 14 is either forward biased, in which case it conducts current, or reverse biased, in which case the diode junction breaks down. In this way, diode 14 provides a current path to prevent the voltage at the gate of transistor 12 from rising to a point sufficient to break down the gate isolation layer. If transistor 12 is an N channel device, positive input voltages would be applied to lead 10 and the orientation of diode 14 would be reversed.

It is known in the art, when fabricating a diode such as diode 14, to increase its perimeter. This is because when a diode breaks down, most of the energy is dissipated along the periphery of the diode because of the well known field curvature phenomenon. This phenomenon is discussed on pages 106–108 of *Physics of Semiconductor Devices* by S. M. Sze, published by Wiley in 1981.

A variation of the circuit in FIG. 1a is provided in FIG. 1b in which a series resistor RS is provided between input lead 10 and the gate of transistor 12. In addition, a resistor RD is illustrated in FIG. 1b indicative of the inherent resistance in diode 14. Resistor RS and RD form a voltage divider network which further limits the voltage present at the gate of transistor 12. Still another variation of the input protection circuit is illustrated in FIG. 1c. Referring to FIG. 1c instead of providing a single resistor RS and a single diode 14, a resistor RS' is provided which can be modeled as a distributed resistor diode network as indicated in Fig. 1c. An analysis of this network is provided in the above-mentioned Lenzlinger article. Unfortunately, none of these circuits are completely effective in preventing damage due to ESD pulses, predominantly for the following reasons. First, during the breakdown mode, the voltage at the gate of transistor 12 is increased by the voltage drop across diode resistance RD. To ensuring sufficient protection requires a very large diode (in order to reduce resistance RD) which is impractical for VLSI circuits. Second, any increase in series input resistance RS increases the RC time delay associated with these circuits.

Another prior art circuit for protecting the gate of an MOS transistor is illustrated in FIG. 1d. Referring to FIG. 1d, an NPN bipolar transistor 16 is connected between the gate of N channel MOS transistor 12 and ground. When a large voltage is applied to input lead 10, transistor 16 breaks down, thus protecting transistor 12. Various geometries for transistor 16 of FIG. 1d are discussed in U.S. Pat. No. 3,787,717 issued to Fischer, et al. and U.S. Pat. No. 4,080,616 issued to Nobory Horie. However, these structures are also not completely effective in preventing damage due to ESD pulses.

SUMMARY

In accordance with the present invention, an input circuit includes the combination of a first resistor diode network, a second resistor diode network, and a bipolar NPN transistor connected to the bonding pad of an integrated circuit to protect the gate of an input MOS transistor.

The first resistor diode network includes a plurality of diodes resistively coupled between the bonding pad and ground. The resistance between each diode and the bonding pad limits the current flowing to any individual diode so that if one diode starts drawing more current than any of the others, that current will be limited so that the diode will not be damaged.

In accordance with another feature of the present invention, the resistance between the bonding pad and each diode increases in response to an increase in the voltage at the bonding pad. Because of this, the amount of current permitted to flow through each diode is limited below a maximum current. This prevents destruction of the diodes when a large voltage is present at the bonding pad. The increase in resistance occurs through a current path pinch-off mechanism similar to the current pinch-off mechanism exhibited by JFET transistors.

In addition, a second resistor-diode network is provided between the bonding pad and the gate of the input transistor. When a voltage sufficient to break down the diodes is applied to the bonding pad, the second resistor-diode network acts as a voltage divider network so that the voltage present at the input MOS transistor gate is attenuated.

The input circuit also includes an NPN transistor having a collector connected to the bonding pad, an emitter connected to ground and a base resistively coupled to ground. This NPN transistor provides additional protection against damage caused by ESD pulses or other high voltages present at the bonding pad. During normal operations, the NPN transistor is off, and therefore only conducts a negligible amount of leakage current from the bonding pad. However, if a voltage greater than approximately 100 volts is applied to the bonding pad, the collector base junction of the NPN transistor breaks down. When this happens, the electrical potential at the base of the NPN transistor increases causing the transistor to turn on, thus permitting the NPN transistor to sink additional current. Further, when this happens, because of a well-known snap back phenomenon, the breakdown voltage across the collector base junction of the NPN transistor drops below 50 volts and therefore enhances protection for the input MOS transistor and prevents destruction of the NPN transistor as well.

The first and second resistor-diode networks and the NPN transistor provide enhanced protection for the gate of an MOS input transistor without disturbing normal operation. In addition, the circuit provides a stable I-V characteristic from 0 to about 100V.

The structure of the present invention also provides effective protection from damage caused by negative ESD pulses. This is because the bonding pad is coupled to an N— well formed in either a P— type epitaxial layer or a P— type substrate. When a negative ESD pulse is applied to the bonding pad, the PN junction between the N— well and the P— epitaxial layer or substrate conducts, thus affording excellent protection from negative ESD pulses.

In an alternative embodiment of the invention, instead of providing an N— well in a P— type epitaxial layer or substrate, a P— well is formed in an N— type epitaxial layer or substrate.

These and other features of the present invention are best understood with references to the drawings below.

DETAILED DESCRIPTION

Figure 1A:
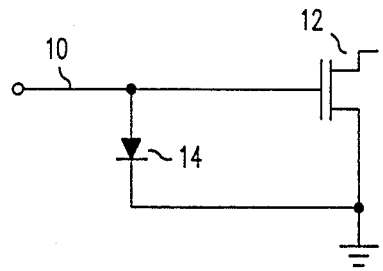
FIGS. 1a through 1d are schematic diagrams of prior art circuits for protecting input MOS transistors in MOS integrated circuits.
Figure 1B:
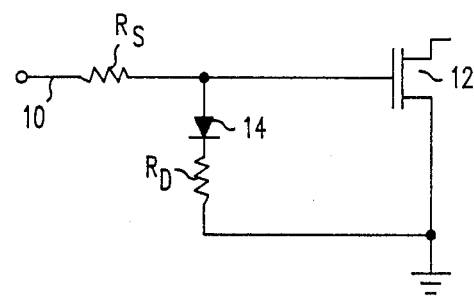
Figure 1C:
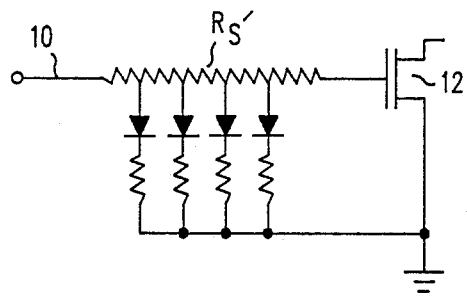
Figure 1D:
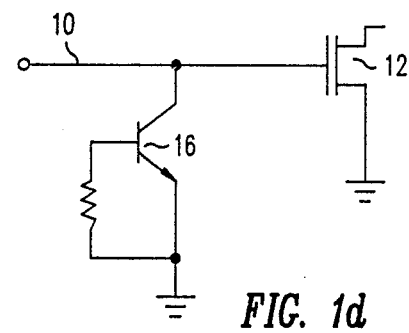
Figure 5:
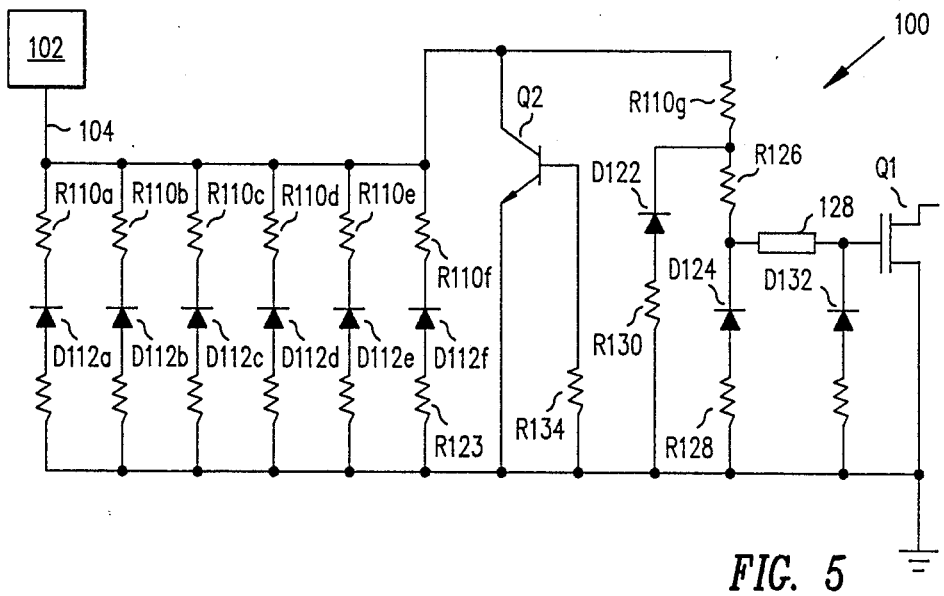
FIG. 5 is a schematic diagram of the circuit of FIG. 2.
Figure 2:
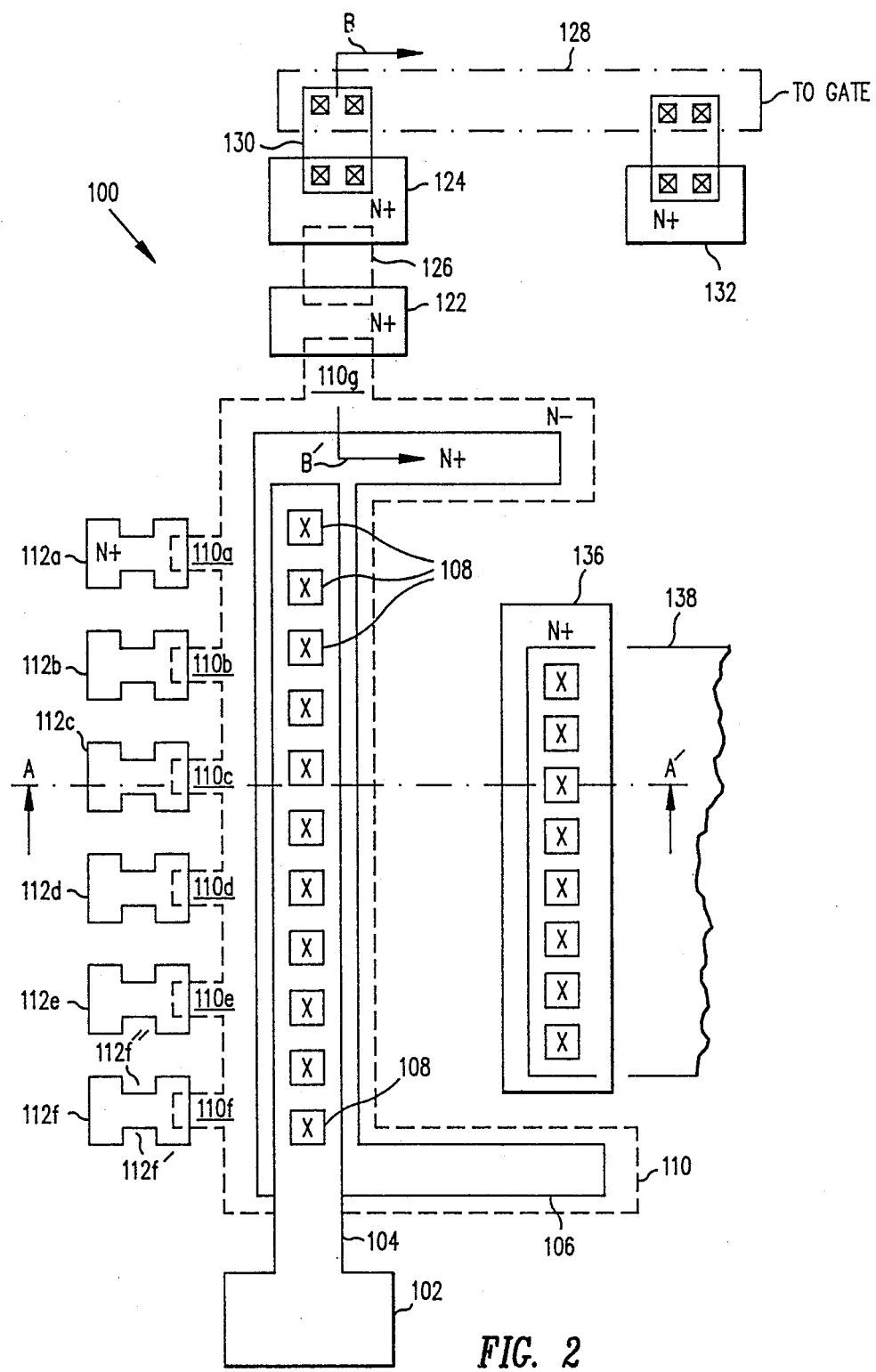
FIG. 2 is a plan view of a circuit for protecting an MOS transistor constructed in accordance with the present invention.

Referring to FIGS. 2 and 5, a circuit 100 constructed in accordance with the present invention protects the gate insulation (typically silicon dioxide) of an MOS transistor Q1 in an integrated circuit. Circuit 100 is connected to a bonding pad 102 which is typically connected to an input pin (not shown) of the integrated circuit. Pad 102 is connected to a metal lead 104 which in turn is connected to an N+ region 106 by a set of vias 108. N+ region 106 is formed within an N— well 110. N— well 110 includes a plurality of fingers 110a through 110f which are used to provide resistive electrical connection between N+ region 106 and a plurality of N+ regions 112a through 112f, respectively. The resistance of fingers 110a through 110f are illustrated in the schematic diagram of FIG. 5 as resistors R110a through R110f, respectively. N+ regions 112a through 112f form the cathodes of diodes D112a through D112f of FIG. 5, respectively. When bonding pad 102 receives an electrostatic pulse and the voltage at bonding pad 102 increases, the voltage at lead 104 increases. If the voltage at lead 104 rises above the breakdown voltage of diodes D112a through D112f, these diodes break down and current is permitted to flow from lead 104 through diodes D112a through D112f and to ground. By providing a current path between lead 104 and ground when lead 104 receives an ESD pulse, circuit 100 decreases the likelihood that the pulse will damage input transistor Q1 by reducing the voltage that would otherwise be present at the gate of transistor Q1.

One feature of the present invention is the provision of resistors R110a through R110f between lead 104 and the cathodes of diodes D112a through D112f, respectively. These resistors prevent excessive current from destroying diodes D112a through D112f. It would normally be possible for one of the diodes D112a through D112f to conduct more current than the others. For example, it is known that if there is a defect in the crystal structure of a diode, more current tends to flow in the vicinity of the defect, with a resulting increase of energy dissipation at that point. If, for example, diode D112f conducted more current than the other diodes (e.g., because of a defect), resistor R110f would have to conduct this additional current. If that happened, the voltage across resistor R110f would be greater than the voltage across resistors R110a through R110e, resulting in a lower voltage across diode D110f than across D110a through D110e. Resistor R110f would therefore limit the current through diode D112f and permit a more even sharing of current between diodes D112a through D112f. In this way, an excessive amount of current through D112f is prevented, and in addition, the likelihood of an ESD pulse destroying the PN junction of diode D112f is reduced.

Figure 3:
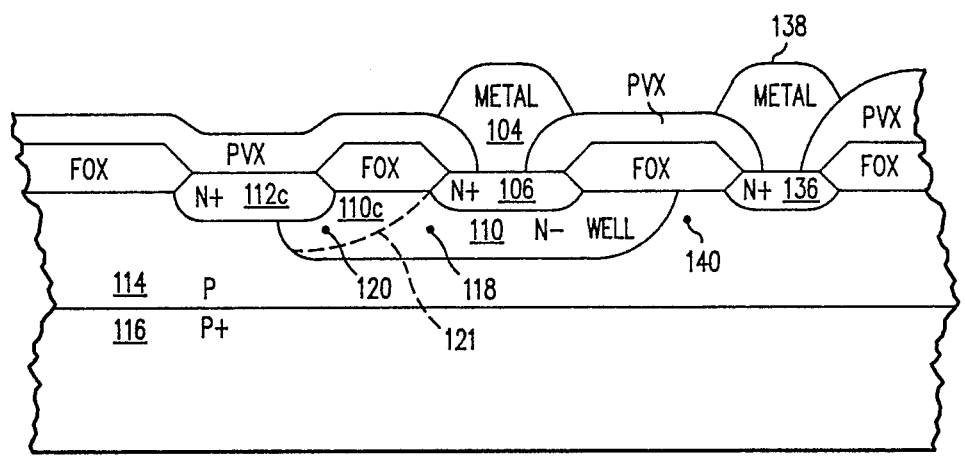
FIG. 3 is an illustration in cross section of the circuit of FIG. 2 taken along lines A—A'.
Figure 7:
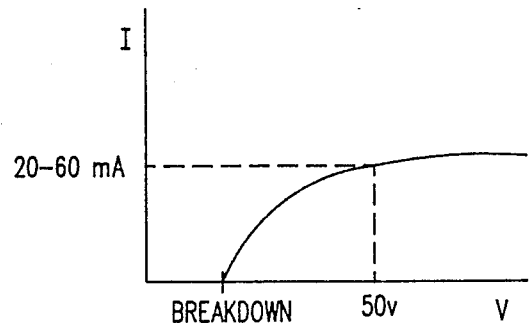
FIG. 7 is a graph of the current-voltage characteristic curve of the resistor-diode network formed by one of diodes D112a through D112f and an associated resistor R110a through R110f of FIG. 5.

In accordance with a novel feature of the invention, the diode structure of FIG. 2 is also capable of withstanding large voltages without catastrophic damage to diodes D112a through D112f because resistors R110a through R110f limit the current through diodes D112a through D112f by exhibiting a pinch off phenomenon. FIG. 7 illustrates the current-voltage relationship of the network formed by resistors R110a through R110f and diodes D112a through D112f. Each of diodes D112a through D112f has a breakdown voltage of approximately 18-20 volts. As the voltage at lead 104 increases, the current through each diode asymptotically approaches an upper limit between 3 and 5 mA for a total of 20 to 40 mA through the entire network depending on the total number of diodes. The reason for this can best be understood with reference to FIG. 3. As is seen in FIG. 3, N— well 110 and N+ region 112c are formed in a P— epitaxial layer 114 which is formed on a P+ substrate 116. The junction between N+ region 112c and P— epitaxial layer 114 forms the PN junction of diode D112c. When diode D112c breaks down, current flows from metal lead 104 through N+ region 106, through N— well 110, through finger 110c, into N+ region 112c, across the PN junction and into epitaxial layer 114. Because finger 110c is resistive, when diode D112c breaks down, the voltage present at point 118 in finger 110c is greater than, for example, the voltage present at point 120. As the voltage at point 118 increases, the depletion region between finger 110c and layer 114 expands and eventually reaches the point where the current path between N+ region 106 and N+ region 112c pinches off, as indicated by dotted line 121, preventing further flow of current in the same way that MOS transistors exhibit pinch off. Accordingly, the structure of the present invention prevents more than a predetermined amount of current (e.g., 3 to 5 mA) from flowing through diodes D112a through D112f and therefore reduces the probability of destroying those diodes. Although circuit 100 is illustrated as including an epitaxial layer, the presence of this layer is not an essential element of the invention. In another embodiment of the invention, the circuit is constructed in a substrate without an epitaxial layer.

Because there is no metal contact to diodes D112a through D112f, the likelihood of metal spiking is reduced. As is well known in the art, spiking occurs when an ESD pulse causes metal to diffuse into silicon. If metal contacting N+ region 106 diffused into P− epitaxial layer 114, the metal would then be short circuited to ground—an undesired result.

Of importance, the ratio of perimeter to area of each of the N+ regions 112a through 112f is increased by providing a set of indentations, e.g., indentation 112f' and 112f'' in N+ region 112f. This adds to the perimeter of N+ regions 112a through 112f without adding to their area. As mentioned above, the diode breaks down at its periphery, hence most of the energy is dissipated along the periphery of the diode. By maximizing the perimeter of diodes D112a through D112f, the energy dissipation through these diodes takes place along a wider area and therefore the diodes can dissipate more energy without being damaged.

As illustrated in FIG. 5, the anodes of diodes D112a through diodes D112f are resistively coupled to ground. For example, the anode of diode D112f is coupled to ground via a resistor R123. Resistor R123 models the resistance exhibited by epitaxial layer 114. Thus, when the PN junction of diode D112f breaks down, current through diode D112f must also flow through epitaxial layer 114 before it reaches grounded substrate 116. The resistors in FIG. 5 between diodes D112a through D112f and ground model that resistance.

Referring to FIG. 3, there are a plurality of regions labeled FOX. These regions form a layer of insulation known as field oxide. Similarly, the regions labeled PVX also form another layer of insulation. The PVX and FOX regions are typically silicon dioxide.

Also referring to FIG. 3, it is noted that N+ region 106 is typically 0.4 microns thick and N− well 110 is typically 3.5 microns thick. Because of the depth of well 110, spiking of metal lead 104 is avoided. This reduces the possibility that metal lead 104 will make contact with epitaxial layer 114 directly and create a short circuit between bonding pad 102 and ground if an ESD pulse is applied to bonding pad 102.

Figure 4:
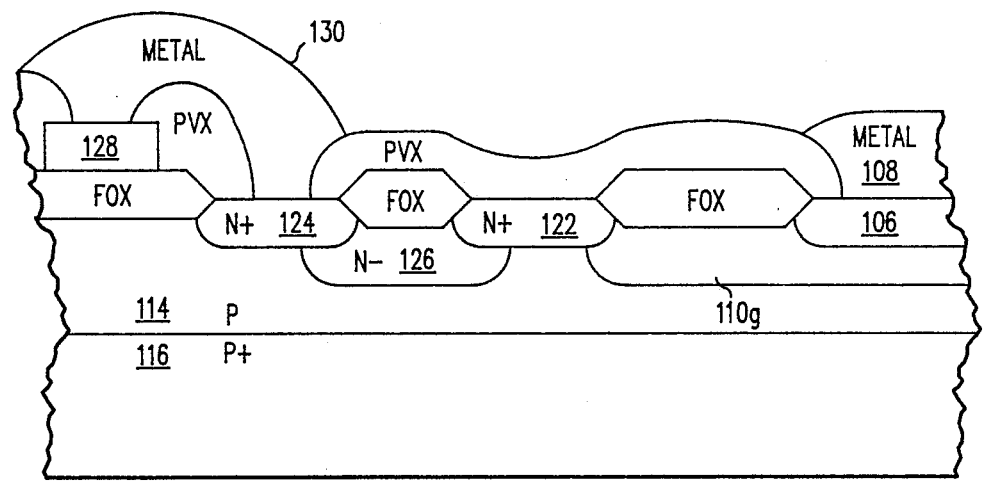
FIG. 4 is an illustration in cross section of the circuit of FIG. 2 taken along lines B—B'.

In accordance with another feature of the invention, lead 104 is connected to a network comprising resistors R110g, R126, R128, R130, diode D122, and diode D124, as illustrated in FIG. 5. This network is used to further attenuate any high voltage signal on lead 104 caused by ESD pulses. Resistor R110g is indicated in FIG. 2 as finger 110g which extends from N− well 100. The cathode of diode D122 is N+ region 122 in FIG. 2, and resistor R126 is formed by an N− region 126. Similarly, the cathode of diode D124 is formed by an N+ region 124. FIG. 4 illustrates N− regions 110g and 126 and N+ regions 122 and 124 in cross section. Referring to FIG. 4, finger region 110g resistively couples N+ region 106 to N+ region 122 and forms resistor R110g of FIG. 5. The junction between N+ region 122 and P− epitaxial layer 114 forms diode D122 and the resistance exhibited by epitaxial layer 114 between that junction and P+ substrate 116 forms resistor R130. N+ region 122 is adjacent to an N-region 126 which forms a resistance corresponding to resistor R126 between N+ region 122 and N+ region 124. The junction between N+ region 124 and P− epitaxial layer 114 forms diode D124 and the resistance exhibited by epitaxial layer 114 forms resistor R128.

In operation, the current through resistor R110g and R126 pinches off in the same manner as in resistors R110a through R110f. When diode D112 or D124 breaks down, resistors R110g, R126, R128 and R130 form a voltage divider network which attenuates the voltage reaching transistor Q1.

The cathode of diode D124 is connected to a polysilicon resistor 128 via a layer of metal 130. Polysilicon resistor 128 provides further resistance between diode D124 and the gate of transistor Q1 to further attenuate the voltage caused by any ESD pulse. The other end of polysilicon resistor 128 is connected to the gate of transistor Q1 as well as an N+region 132 which forms the cathode of a diode D132 which also protects the gate of transistor Q1. Although resistors R110g, R126 and polysilicon resistor 128 provide a series resistance of about 1 to 10 kΩ between input lead 104 and the gate of transistor Q1, they do not seriously degrade the performance and speed of transistor Q1. This is because the gate capacitance of transistor Q1 is on the order of femtofarads and any corresponding RC time constant caused by resistors R110g, R126, and R128 and the gate capacitance of transistor Q1 is small enough to be negligible during normal operation of the circuit, e.g., less than 1 ns.

Figure 6:
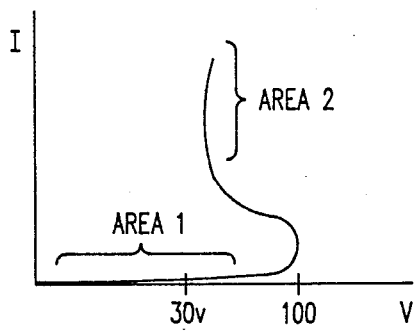
FIG. 6 is a graph of the current-voltage characteristic curve of the NPN transistor of FIG. 5 during breakdown.

If a high voltage is placed on lead 104, it is desirable to provide another structure for sinking any additional current caused by large voltages at bonding pad 102. Accordingly, another feature of the present invention is the inclusion of an NPN transistor Q2 having a collector connected to lead 104, an emitter connected to ground and a base resistively coupled to ground via a resistor R134. Referring to FIGS. 2 and 3, the emitter of transistor Q2 is formed by an N+ region 136 which is connected to ground via metal 138. The collector of transistor Q2 is formed by N− well 110 and the base of transistor Q2 is formed by the portion of P− epitaxial layer 114 between N− well 110 and N+ region 136. Resistor R134 is formed by the resistance of epitaxial layer 116. between the base of transistor Q2 and P+ substrate 116. The I-V characteristic of transistor Q2 is illustrated in FIG. 6. As the voltage at lead 104 increases, transistor Q2 initially only conducts a small amount of leakage current in the nanoamp range as indicated by area 1 of the I-V characteristic curve. When the voltage at lead 104 reaches approximately 100 volts, the collector-base junction of transistor Q2 starts to break down. When that happens, current flows from N− well 110 through the epitaxial layer 114 and to ground. Because of the resistance of epitaxial layer 114, the voltage present at point 140 (FIG. 3) increases. This increase in voltage is sufficient to turn on the base emitter junction of transistor Q2 and transistor Q2 starts to turn on. (In embodiments without an epitaxial layer, it is the substrate resistance that causes the base-emitter junction of transistor Q2 to turn on. As discussed below, without an epitaxial layer, current through diodes D112a through D112f may also cause transistor Q2 to turn on.) When this happens, the I–V characteristic curve snaps back to a voltage of approximately 30 volts and thereafter transistor Q2 prevents the voltage at lead 104 from increasing beyond about 30 volts. (The snapback phenomenon is well known in the art, and is discussed on pages 174–176 of "Semiconductor Power Devices—Physics of Operation and Fabrication Technology" by Sorab K. Ghandhi, published by John Wiley and Sons in 1977 and incorporated herein by reference.) In this way, transistor Q2 dissipates enough current so that the voltage of lead 104 never rises past about 100 volts, thus protecting transistor Q1. When transistor Q2 operates in a mode indicated by area 2 of the I–V characteristic curve, current is conducted through transistor Q2 in both a collector-base junction breakdown mode and a normal current conduction mode in which collector current is responsive to the electrons injected into the base from the emitter (N+ region 136). The combination of carriers from the normal current conduction mode and the breakdown current conduction mode is sufficient to provide enough carriers at the collector-base junction to cause a sufficient number of carrier-lattice collisions to maintain avalanche breakdown current across the collector base junction with the collector at about 30 volts. This keeps transistor Q2 on with about 30 volts applied to the collector in the region of the I–V curve marked area 2. The 100 volt collector breakdown voltage and 30 volt snapback voltage are merely approximate and exemplary values. Other voltages work equally well.

During snap-back, injection of minority carriers (electrons) from the emitter into epitaxial layer 114 (or substrate) causes an increase in epitaxial layer conductivity in order to maintain space-charge neutrality. This keeps the voltage drop across resistor R134 low and further helps to clamp the collector voltage at transistor Q2 to about 30 volts.

In summary, the configuration of NPN transistor Q2 permits effective dissipation of very high electrostatic energy without damage to the gate oxide or damage to the protection structure (circuit 100) itself.

Of importance is the fact that the collector of transistor Q2 is coupled to lead 104 via a distributed N well resistance. Thus, if the current density at one point of the collector of transistor Q2 becomes large, e.g., because of a crystal defect, the resistance of N− well 110 helps protect the collector by limiting the current therethrough. The low dopant density of N− well 110 further reduces the localization of current, making the bipolar transistor more effective. Also of importance, N− well 110 is about an order of magnitude deeper than the N+ emitter. This adds to the efficiency of the collector of transistor Q2.

One feature of the structure of FIG. 2 is that the PN junctions of diodes D112a through D112f are positioned on one side of N− well 110 while the base-collector junction of transistor Q2 is on the other side of N− well 110. Because of this, when the PN junction adjacent N+ region 112c breaks down, a voltage increase at the portion of epitaxial layer 114 adjacent the PN junction will have a very small effect on the base voltage of transistor Q2. In this way, transistor Q2 breaks down in response to a high voltage at lead 104 and not in response to current through diodes D112a through D112f.

In an embodiment lacking an epitaxial layer, the isolation between the base collector junction of transistor Q2 and diodes D112a through D112f is not as great as in an embodiment including epitaxial layer 114. Accordingly, in such an embodiment current flow through the substrate can raise the base emitter junction voltage drop, causing NPN transistor Q2 to start to turn on when the bonding pad is at a voltage below the collector base breakdown voltage.

Also of importance, because transistor Q2 and diodes D112a through D112f are on opposite sides of N− well 110, the current flow through diodes D112a through D112f does not increase the current density near transistor Q2 to any large extent, and current density through transistor Q2 does not increase the current density near the diodes.

Figure 8:
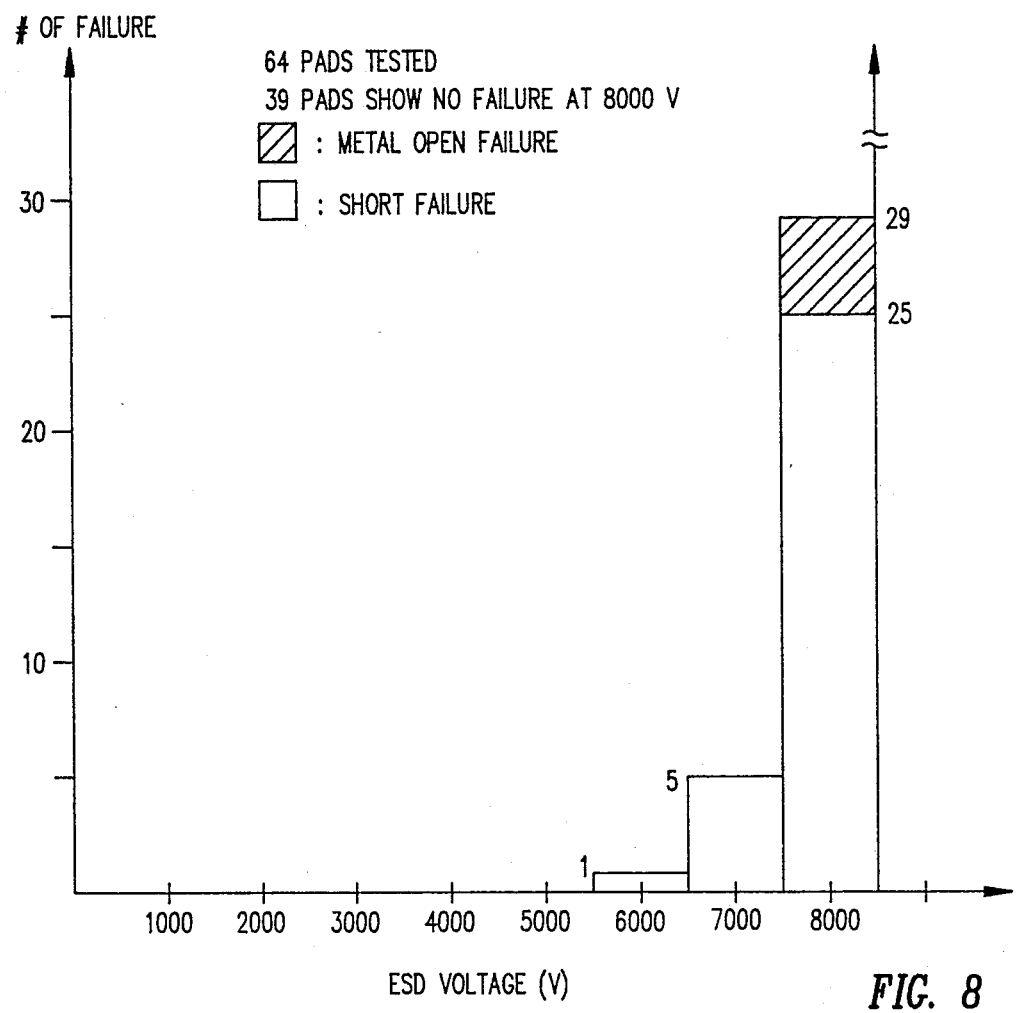
FIG. 8 is a histogram indicating test results achieved with the circuit of the present invention.

FIG. 8 is a histogram of test results achieved with the present invention. An ESD pulse was simulated by charging a 100 pF capacitor to the voltage indicated and allowing it to discharge through a 1.5 K ohm resistor through the bonding pad in accordance with MIL STD 883C. (As is known in the art, MIL STD 883C is a military standard for testing integrated circuits.)

While the invention has been described in detail with reference to a specific embodiment, those skilled in the art will recognize that changes can be made in form and detail without departing from the spirit and scope of the invention. For example, instead of constructing N+ region 106, N− well 110 and N+ regions 112a through 112f in P epitaxial layer 114, the structure of the present invention could be constructed using P regions in a N type epitaxial layer. Such an embodiment would use negative input voltages. Other embodiments could be constructed without the use of any epitaxial layer. Accordingly, all such changes come within the scope of the present invention.

We Claim:

1. A circuit for coupling to a bonding pad and for protecting an input transistor comprising:

a plurality of diodes, each diode within said plurality of diodes having a first lead coupled to ground and a second lead;

a plurality of resistors, each resistor associated with one of said diodes within said plurality of diodes, each resistor coupled between the second lead of said associated diode and said bonding pad, said resistors tending to cause an even current distribution between said diodes when said diodes break down;

a bipolar transistor having a collector coupled to said bonding pad, a base resistively coupled to ground, and an emitter coupled to ground, said bipolar transistor conducting current in response to a voltage at said bonding pad greater than the base collector break down voltage, whereby said bipolar transistor prevents damage to said input transistor when an electrostatic discharge pulse is applied to said bonding pad; and a resistor diode network comprising:

a first resistor having a first lead connected to said bonding pad and a second lead;

a first diode having a first lead coupled to said second lead of said first resistor and a second lead coupled to ground;

a second resistor connected having a first lead connected to the second lead of said first resistor and a second lead;

a second diode having a first lead coupled to the second lead of said second resistor and a second lead coupled to ground, said second lead of said second diode being resistively coupled to the gate of said input transistor, whereby said plurality of diodes, said transistor and said resistor diode network act to prevent damage to said input transistor when a large voltage is applied to said bonding pad.

2. A circuit for coupling to a bonding pad comprising:

an N— well coupled to said bonding pad, said N— well being formed in a P doped region;

a plurality of N— regions extending from said N— well;

a first plurality of N+ regions, each N+ region within said plurality being adjacent to and connected with an associated N— region within said plurality of N— regions, said first plurality of N+ regions being formed within said P doped region, the PN junctions between said first plurality of N+ regions and said P doped region forming a plurality of diodes, said plurality of N— regions forming a plurality of resistors between said plurality of diodes and said, N— well;

A first N+ region formed within said P doped region spaced apart from said N— well, said first N+ region forming an emitter of an NPN transistor, said first N+ region being coupled to ground, the space between said first N+ region and said N— well forming the base of said NPN transistor, said first N+ region being on one side of said N— well, said plurality of N+ regions being on the opposite side of said N— well, said N— well acting as the collector of said NPN transistor;

a second N+ region formed in said P doped region, the junction between said second N+ region and said P doped region forming a diode, said second N+ region being resistively coupled to said N— well;

a third N+ region formed in said P doped region, the junction between said third N+ region and said P doped region forming a diode, said third N+ region being resistively coupled to said second N+ region; and an MOS transistor having a gate resistively coupled to said third N+ region.

3. The circuit of claim 2 wherein the resistance of the resistors formed by said plurality of N— regions increases in response to an increase in voltage at said bonding pad.

4. The circuit of claim 2 wherein said P doped region is a P— epitaxial layer.

5. The circuit of claim 2 wherein said P doped region is a P—substrate.

6. A circuit for protecting an input transistor comprising:

a bonding pad for receiving an input signal;

a plurality of resistors, each resistor within said plurality of resistors having a first lead coupled to said bonding pad and a second lead, wherein each of said first leads are coupled together;

a terminal for receiving a voltage; and a plurality of diodes, each diode within said plurality being associated with a unique one of said resistors, each diode having a first lead coupled to the second lead of said associated resistor and a second lead coupled to said terminal, said diodes breaking down in response to a voltage greater than the breakdown voltage of said diodes at said bonding pad, said resistors ensuring a sharing of the power dissipation when said diodes break down, and wherein the current through said diodes is below a leakage value when the voltage at said bonding pad is below the breakdown voltage of said diodes, the current through said diodes increasing when the voltage at said bonding pad is greater than the breakdown voltage of said diodes, the current through said resistors asymptotically reaching a maximum current as the voltage at said bonding pad increases past said breakdown voltage.

7. The circuit of claim 6 wherein each of said resistors comprise an N— region and each of said diodes comprise an N+ region, each of said N— regions making contact with one of said N+ regions whereby said resistors make electrical contact to said diodes without the use of a metal contact.

8. The circuit of claim 6 further comprising:

an N— well coupled to said bonding pad;

an N+ region formed near said N— well, said N+ region being connected to terminal, said N— well constituting the collector of an NPN transistor, said N+ region forming the emitter of said NPN transistor, the area between said emitter and said collector forming the base of said NPN transistor, said base being resistively coupled to terminal, said N+ region being positioned on one side of said N— well, said plurality of diodes being positioned on the other side of said N— well, whereby said diodes and the base emitter junction of said NPN transmitter are substantially isolated from each other, said NPN transistor breaking down in response to a voltage present at said bonding pad greater than the collector base breakdown voltage of said NPN transistor.

9. The circuit of claim 6 further comprising:

an N— well coupled to said bonding pad;

an N+ region formed near said N— well, said N+ region being coupled to terminal, said N— well constituting the collector of an NPN transistor, said N+ region forming the emitter of said NPN transistor, the space between said N+ region and said N— well forming the base of said NPN transistor, said N+ region being positioned on one side of said N— well, said plurality of diodes being positioned on the other side of said N— well, said transistor conducting current in response to the flow of current through said plurality of diodes.

10. A circuit comprising:

a bonding pad;

a P— well coupled to said bonding pad, said P— well being formed in an N doped region;

a plurality of P— regions extending from said P— well;

a plurality of P+ regions, each P+ region being adjacent to and connected with an associated P— region within said plurality of P— regions, said plurality of P+ regions being formed within said N doped region, the PN junctions between said first plurality of P+ regions and said N doped region forming a plurality of diodes, said plurality of P— regions forming a plurality of resistors between said plurality of diodes and said P— well;

a first P+ region formed within said N doped region spaced apart from said P− well, said first P+ region forming an emitter of a PNP transistor, the space between said first P+ region and said P− well forming the base of said PNP transistor, said first P+ region being on one side of said P− well, said plurality of P+ regions being on the opposite side of said P− well, said P− well acting as the collector of said PNP transistor;

a second P+ region formed in said N doped region, the junction between said second P+ region and said N doped region forming a diode, said second P+ region being resistively coupled to said P− well;

a third P+ region formed in said N doped region, the junction between said third P+ region and said N doped region forming a diode, said third P+ region being resistively connected to said second P+ region; and an MOS transistor having a gate resistively coupled to said third P+ region.

11. The circuit of claim 10 wherein said N doped region is an N− epitaxial layer.

12. The circuit of claim 10, wherein said N doped region is an N− substrate.

13. A circuit for coupling to a bonding pad and for protecting an input transistor comprising:

a plurality of diodes, each diode within said plurality of diodes having a first lead coupled to ground and a second lead;

a plurality of resistors, each resistor associated with one of said diodes within said plurality of diodes, each resistor coupled between the second lead of said associated diode and said bonding pad, said resistors tending to cause an even current distribution between said diodes when said diodes break down;

a bipolar transistor having a collector coupled to said bonding pad, a base resistively coupled to ground, and an emitter coupled to ground, said bipolar transistor conducting current in response to a voltage at said bonding pad greater than the base collector breakdown voltage, whereby said bipolar transistor prevents damage to said input transistor when an electrostatic discharge pulse is applied to said bonding pad; and a resistor diode network comprising:

a first resistor having a first lead connected to said bonding pad and a second lead;

a first diode having a first lead connected to said second lead of said first resistor and a second lead coupled to ground;

a second resistor having a first lead coupled to the second lead of said first resistor and a second lead;

a second diode having a first lead coupled to the second lead of said second resistor and a second lead coupled to ground, said second lead of said second diode being coupled to the gate of said input transistor, whereby said plurality of diodes, said transistor and said resistor diode network act to prevent damage to said input transistor when a large voltage is applied to said bonding pad.

14. A circuit for coupling to a bonding pad comprising:

an N− well coupled to said bonding pad, said N− well being formed in a P doped region;

a plurality of N− regions extending from said N− well;

a first plurality of N+ regions, each N+ region within said plurality being adjacent to and connected with an associated N− region within said plurality of N− region, said first plurality N+ regions being formed within said P doped region, the PN junctions between said first plurality of N+ regions and said P doped region forming a plurality of diodes, said plurality of N− regions forming a plurality of resistors between said plurality of diodes and said N− well;

a first N+ region formed within said P doped regions spaced apart form said N− well, said first N+ region forming an emitter of an NPN transistor, said first N+ region being coupled to ground, the space between said first N+ region and said N− well forming the base of said NPN transistor, said first N+ region being on one side of said N− well, said plurality of N+ regions being on the opposite side of said N− well, said N− well acting as the collector of said NPN transistors;

a second N+ region formed in said P doped region, the junction between said second N+ region and said P doped region forming a diode, said second N+ region being resistively coupled to said N− well;

a third N+ region formed in said P doped region, the junction between said third N+ region and said P doped region forming a diode, said third N+ region being resistively coupled to said second N+ region; and an MOS transistor having a gate coupled to said third N+ region.

15. A circuit comprising:

a bonding pad;

a P− well coupled to said bonding pad, said P− well being formed in an N doped region;

a plurality of P− regions extending from said P− well;

a plurality of P+ regions, each P+ region being adjacent to and connected with an associated P− region within said plurality of P− regions, said plurality of P+ regions being formed within said N doped region, the PN junctions between said first plurality of P+ regions and said N doped region forming a plurality of diodes, said plurality of P− regions forming a plurality of resistors between said plurality of diodes and said P− well;

a first P+ region fromed within said N doped region spaced apart from said P− well, said first P+ region forming an emitter of an PNP transistor, the space between said first P+ region and said P− well forming the base of said PNP transistor, said first P+ region being on one side of said P− well, said plurality of P+ regions being on the opposite side of said P− well, said P− well acting as the collector of said PNP transistor;

a second P+ region formed in said N doped region, the junction between said second P+ region and said N doped regions forming a diode, said second P+ region being resistively coupled to said P− well;

a third P+ region formed in said N doped region, the junction between said third P+ region and said N doped region forming a diode, said third P+ region being resistively connected to said second P+ region; and an MOS transistor having a gate coupled to said third P+ region.

* * * * *